United States Patent [19]

Bartol, Jr.

[11] 4,296,376

[45] Oct. 20, 1981

[54] PROBE FOR SENSING CHARACTERISTICS OF ELECTRICAL DEVICES UTILIZING A MAGNETIC SWITCH SENSOR BIASED BY AN ENCIRCLING MAGNETIC BIASING MEANS

[76] Inventor: Robert J. Bartol, Jr., 931 E. Tenth Pl., Mesa, Ariz. 85203

[21] Appl. No.: 7,472

[22] Filed: Jan. 29, 1979

Related U.S. Application Data

[63] Continuation of Ser. No. 889,838, Mar. 24, 1978, abandoned.

[51] Int. Cl.3 ..................... G01N 27/72; G01R 33/12; G01R 19/14

[52] U.S. Cl. ................................ 324/235; 324/117 R; 324/133; 324/260

[58] Field of Search ............... 324/133, 235, 244, 259, 324/260, 117 R; 335/151, 153, 154; 340/635, 651, 664

[56] References Cited

U.S. PATENT DOCUMENTS

| | | | |
|---|---|---|---|
| 1,292,279 | 1/1919 | Eisemann | 324/259 |
| 2,461,202 | 2/1949 | Ellwood | 324/259 |
| 2,673,404 | 3/1954 | Abrahamson | 324/228 |
| 2,749,663 | 5/1956 | Lemeson | 324/259 |
| 2,794,166 | 4/1957 | Ferdon et al. | |
| 3,397,348 | 8/1968 | Hoeppel | 335/151 |
| 3,665,511 | 4/1972 | Wolf | 324/244 |
| 4,115,764 | 9/1978 | Yamaguchi et al. | 324/133 |

FOREIGN PATENT DOCUMENTS

| | | | |
|---|---|---|---|
| 2344209 | 10/1977 | France | 324/133 |
| 433320 | 11/1974 | U.S.S.R. | 324/133 |

OTHER PUBLICATIONS

Moskowitz, "Selecting Magnets for Reed Switch Actuation", 10/1968, Automation, pp. 66–71.

*Primary Examiner*—Gerard R. Strecker
*Assistant Examiner*—Walter E. Snow
*Attorney, Agent, or Firm*—Warren F. B. Lindsley

[57] ABSTRACT

A probe for sensing energizations of electrical components and particularly the energization of a relay or solenoid, the probe utilizing a magnetic switch as a sensor, a light-emitting diode as an indicator and a battery as a power source, the elements encapsulated as a unit in an epoxy material.

5 Claims, 17 Drawing Figures

PROBE FOR SENSING CHARACTERISTICS OF ELECTRICAL DEVICES UTILIZING A MAGNETIC SWITCH SENSOR BIASED BY AN ENCIRCLING MAGNETIC BIASING MEANS

This application is a continuation in part of U.S. patent application, Ser. No. 889,838, filed March 24, 1978 and entitled RELAY AND SOLENOID PROBE, now abandoned.

BACKGROUND OF THE INVENTION

In the servicing and trouble-shooting of electromagnetic equipment of various types the serviceman or technician often needs to know whether a relay or solenoid has been energized. Many such devices are enclosed or the armature is obscured by other parts so that it is impossible to determine by visual examination whether or not the relay or solenoid has operated.

It then becomes necessary to check coil voltages, continuity of contacts, etc. with a voltmeter and/or an ohm-meter. This involves the time consuming persual of wiring diagrams, the careful tracing of wiring, and the probing of energized circuits which often operate at hazardous voltages. This method is not always accurate because of the possibility of errors in the tracing of diagrams or wiring. Furthermore, if the coil of the relay is "open" the meter check yields incomplete information.

What is needed is a simple instrument which may be conveniently employed to probe the magnetic field surrounding the relay or solenoid to determine very quickly whether or not it has been energized.

DESCRIPTION OF THE PRIOR ART

Devices of this nature have been taught in the prior art.

The Eisenmann U.S. Pat. No. 1,292,279 discloses a current detector having a vibrator which may be combined with an auditory device to give a signal when actuated by an alternating current or other form of varying magnetic field. For this purpose, a contact is mounted in a tube immediately adjacent but normally out of engagement with the end of the member with which it is connected in an electric circuit. The vibration of this member under the action of a varying magnetic field will then cause the member to alternately engage and disengage the contact thus making a succession of recognizable sounds in a receiver.

Eisenmann's method requires alternating current and varying direct current while the disclosed configuration works on alternating current, varying direct current and direct current. Eisenmann's instrument must have changing current in order to detect current flow.

The Ellwood U.S. Pat. No. 2,461,202 discloses a magnetic testing device of the reed relay configuration in which magnetic reeds are enclosed in a vessel and which may be magnetized to establish a connection between them on the energization of an outside coil.

Ellwood merely discloses a device employing a reed type relay and he determines magnetic properties by opposing fields. In FIGS. 2, 3 and 4 of Ellwood, wires are wrapped around the reed switches which structure is impractical in the discloses claimed configuration for utilization as a relay and solenoid tester.

The Ferdon et al U.S. Pat. No. 2,794,166 discloses a walking stick for the blind which contains a built in alarm circuit which will advise the user that he is following a prescribed path. A buzzer or other vibrating device is mounted in the mounting stick intermediate a battery and its tip. Magnetic strips are placed on the floor and extend into the various rooms used by the blind individual and these strips draw the permanent magnet of the walking stick downward against the action of a spring to move laterally an extending portion into the operative position to bridge contacts that sound a buzzer. This action advises the user that he is following the path prescribed and that the tip of the cane is in contact with the metal strips on the floor.

The Yamaguchi et al U.S. Pat. No. 4,115,764 discloses a similar type sensor to that of Ferdon et al utilizing a magnetic reed switch.

The Lemelson U.S. Pat. No. 2,749,663 discloses a toy mine detector which provides an audible or visible warning in response to the toy being brought into proximity to a magnetic or magnetic susceptible material.

The Abrahamson U.S. Pat. No. 2,673,404 discloses a magnetic game apparatus involving magnetizable elements which become endowed with or produce visible or audible activity upon the establishment either momentary or prolonged of a magnetic circuit between such elements and magnet means located in a supporting surface.

While the prior art devices address the problem with a degree of success, a totally effective and useful probe for use in the trouble-shooting application described herein is yet to be made available. The prior art devices are unnecessarily complex and lacking in the essential features required in a probe for relays and solenoids. In particular, the sensitivity of the prior art devices is typically too low to monitor relatively weak fields. Furthermore, no means is provided for adjustment of sensitivity as required for differentiation between competing sources of magnetization which are to be individually monitored.

SUMMARY OF THE INVENTION

In accordance with the invention claimed, an improved relay and solenoid probe is provided which may be employed by a serviceman or technician to determine very quickly and conveniently the state of the relay or solenoid relative to its energization.

It is, therefore, one object of the invention to provide an improved tool or probe for use as trouble-shooting tool to determine the state of a relay or solenoid.

Another object of this invention is to provide such a tool which functions with equal effectiveness in the probing of either a-c or d-c relays.

A further object of this invention is to provide such a tool in a form which is easy to use and which gives a quick and positive indication of the state of the relay or solenoid.

A still further object of this invention is to provide such a tool which monitors the stray field of the relay or solenoid and thereby obviates the need for tracing wires and diagrams and making voltage measurements.

A still further object of this invention is to provide such a tool in rugged yet compact form so that it may be conveniently stored in an ordinary tool-box without danger of being damaged.

A still further object of this invention is to provide such a tool with an unusually high sensitivity and hence a capability for detecting particularly low magnetic field strengths.

A still further object of this invention is to provide such a tool with a means for adjusting its sensitivity and hence with a capability for differentiating between competing fields originating from adjacent magnetic components.

A still further object of this invention is to provide such a tool with a capability for detecting the flow of current in electrical conductors.

A still further object of this invention is to provide as an accessory to such a tool a special coil assembly which may be mounted in equipment intended for monitoring by the tool, the coil assembly being connected to carry the current to be monitored and specially formed to receive the tip of the probe.

A still further object of this invention is to provide in such a tool a set of terminals to which may be connected an external indicator counter or other read-out device for monitoring the nature of the field sensed by the tool.

A still further object of the invention is to provide as an accessory for such a tool a means for judging the relative strength of the field being probed.

Yet another object of this invention is to provide such a tool in a form which is inexpensive in construction and inherently reliable for long-term use.

Further objects and advantages of the invention will become apparent as the following description proceeds and the features of novelty which characterize the invention will be pointed out with particularity in the claims annexed to and forming a part of this specification.

BRIEF DESCRIPTION OF THE DRAWING

The present invention may be more readily described by reference to the accompanying drawing, in which.

DESCRIPTION OF THE PREFERRED EMBODIMENT

Figure 1:
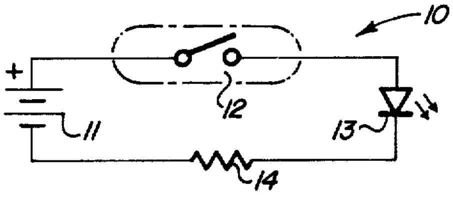
FIG. 1 is a circuit diagram showing the interconnection of the electrical components utilized in the relay and solenoid probe of the invention.
Figure 2:
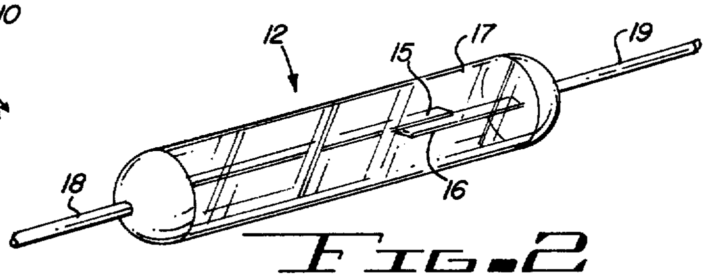
FIG. 2 is a simplified perspective view of a magnetic reed switch of the type employed as one of the components of the probe.
Figure 3:
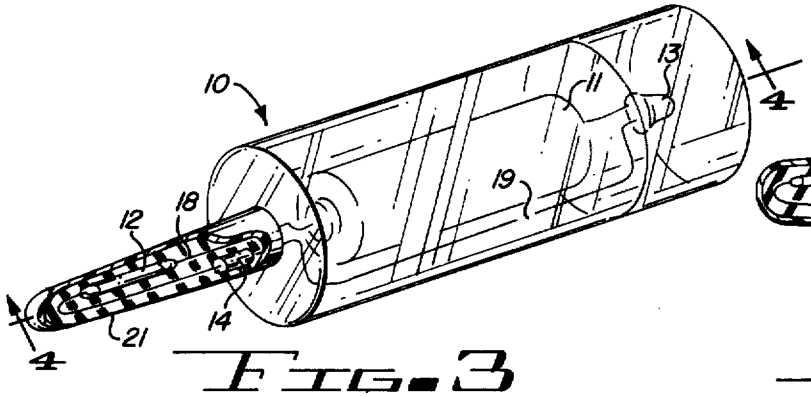
FIG. 3 is a perspective view of a totally encapsulated probe according to the teaching of the invention with the location of internal parts suggested by broken lines.
Figure 4:
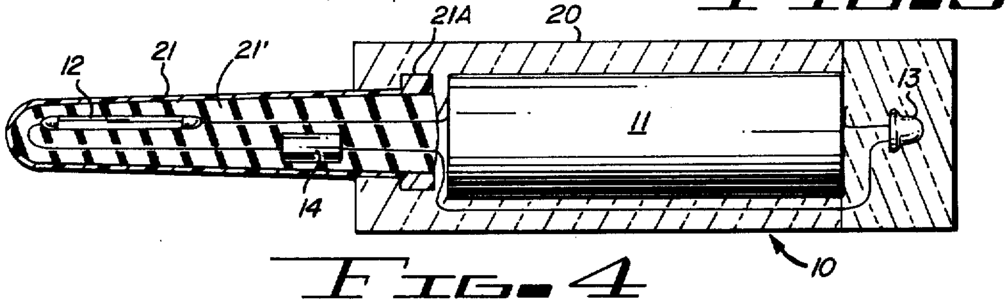
FIG. 4 is a cross-sectional view of the probe of FIG. 3 taken along line 4—4 of FIG. 3.

Referring more particularly to the drawing by characters of reference, FIGS. 1-4 disclose an improved relay and solenoid probe 10 of the invention, the probe 10 comprising a storage battery 11, a switch such as, for example, a magnetic reed switch 12, an indicator lamp 13, and an optional current-limiting resistor 14, the enumerated parts being serially connected in a closed circuit as shown in FIG. 1 and encapsulated in a casting material 20 as shown in FIG. 4.

Switch 12, as shown most clearly in the enlarged view of FIG. 2, serves as the sensing element of probe 10 and comprises two magnetic reeds 15 and 16 mounted inside a non-magnetic housing 17 with lead wires 18 and 19 connected, respectively, to reeds 15 and 16 and brought out as electrical terminals through one end of housing 17. At least one of the reeds 15 and 16 is pivotally mounted or is sufficiently flexible so that when relay 12 is placed in a magnetic field a portion of the field is intercepted by the reeds 15 and 16 with the consequence that reeds 15 and 16 are drawn together by their resulting magnetization and electrical contact between reeds 15 and 16 is thereby effected. Relays of this type are produced by Sigma Instrument (Part 3A31-103). In the usual application of reed relays a coil of wire (not shown) is wound around housing 17 with induced current through the coil producing a magnetic field to close the reed contacts. In the case of the present invention, the coil is not necessarily utilized and may in some instances be omitted in the construction of the relay 12.

Referring now to FIG. 1, it is apparent that when the contacts of switch 12 are closed due to the presence of an a-c or d-c magnetic field, a current flows from the positive plate of the battery 11 through switch 12, lamp 13 and resistor 14 to the negative plate of battery 11. The current flowing through lamp 13 produces a visual indication of the presence of the magnetic field which caused the closing of the contacts of switch 12. Resistor 14 limits the current through lamp 13.

Lamp 13, as shown in FIGS. 1, 3 and 4, is preferably a light-emitting diode (LED) which is a special P-N junction produced by a number of semiconductor manufacturers for use as a very low power indicating device exhibiting a very long operating life as compared with incandescent lamps. A device of this type is commonly made with gallium arsenide as one of the semiconductor materials and in its most common form it emits a red light when energized. The typical operating current is fifteen to twenty milliamperes or less and the voltage drop across the device is approximately one volt. If the voltage of the energizing source is appropriately matched to the intrinsic drop of the LED and to its inherent internal resistance, no series dropping resistor is required, but in the typical application a series current-limiting resistor is preferred.

In the preferred embodiment of FIGS. 3 and 4, battery 11, switch 12, lamp 13 and resistor 14 are interconnected, as shown in FIG. 1 and encapsulated into a single integral unit. The encapsulated probe 10 is generally cylindrical with switch 12 contained in a projection 21 of reduced diameter extending axially from the forward end. The projection 21 is a preformed resilient plastic hollow probe-like member having a collar 21A at one end. The probe is filled with a different suitable elastomer resilient plastic material 21'. The probe 21 is formed first and then its large end is encapsulated in the more cylindrical portion of the probe. The main body or cylindrical portion houses the battery 11 and lamp 13. The diameter of the main body is adequate to contain battery 11, which is the largest of the component parts and is sufficiently small to be held comfortably in the handle. The reduced diameter and resiliency of projection 21 permits probing into the confined spaces adjacent the relays and solenoids to be probed in the use of probe 10 by a serviceman or technician.

Figure 5:
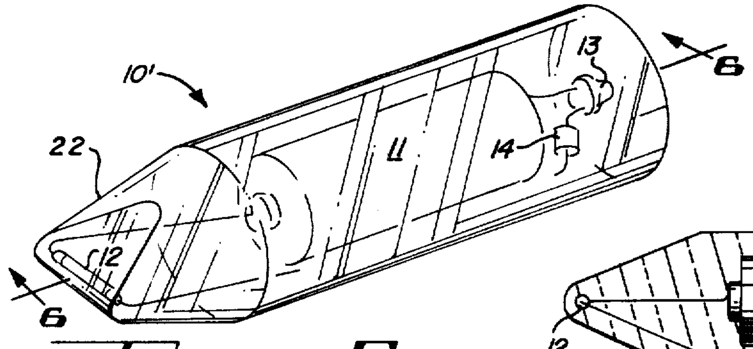
FIG. 5 is a perspective view of a variation of the probe of FIGS. 1-4 in which the orientation of the magnetic reed switch is altered and the encapsulation contours modified accordingly.

In certain uses of the disclosed device, the modified contours of the probe 10' of FIG. 5 may prove advantageous. The wedge-shaped nose 22 which houses switch 12 affords additional mechanical strength with a minimal loss of accessibility to probed parts.

Figure 6:
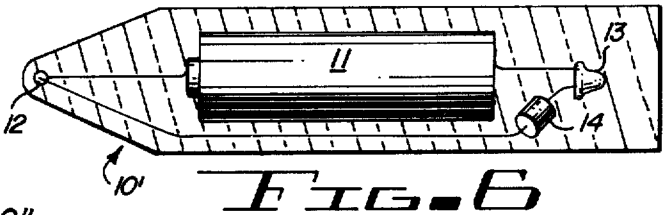
FIG. 6 is a cross-sectional view of the probe of FIG. 5 taken along line 6—6 of FIG. 5.

It might also be found that for some applications the axial orientation of switch 12 as shown in FIGS. 1–4 is not optimum and that the transverse orientation of FIGS. 5 and 6 provides greater sensitivity. The transverse arrangement of relay 12 suggests the tapered blade contour at the sensing tip.

The encapsulating material 20 forming the cylindrical portion of probe 10 is preferably an initially clear epoxy or other plastic material of good mechanical strength which may be tinted with a red dye to obscure the internal components while providing good propagation of the red light emitted by lamp 13. With this type of encapsulation the normally directional characteristic of the LED employed as lamp 13 is modified so that the entire rear end of probe 10 glows red when an energized solenoid or relay is probed. Improved visibility of lighted lamp 13 from any angle is thus afforded.

Because the LED requires such a low current for illumination, battery 11 will last a long time (typically many months). For this reason and because the cost of the parts and assembly labor for the probe are very low, the one-piece, totally encapsulated construction of FIGS. 3–6 becomes highly practical as a throw-away unit to be discarded when battery 11 is depleted.

Figure 7:
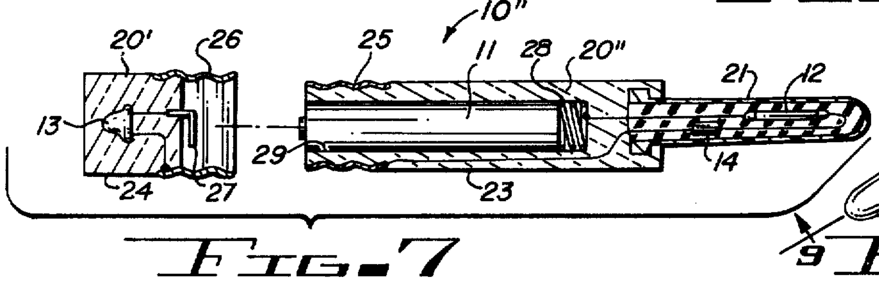
FIG. 7 is a cross-sectional view of another variation of the probe of the invention wherein all elements of the device are encapsulated with the exception of the replaceable battery.

Alternatively, the variation of FIG. 7 may be employed which, at the expense of an initially higher assembly cost, permits the replacement of battery 11. The probe 10'' of FIG. 7 is encapsulated in two parts including a forward part 23 and a rear part 24. The rear part 24 houses a lamp 13 and the forward part 23 houses switch 12, battery 11 and resistor 14. The external contours of part 24 approximate the contours of the rear portion of the probes of FIGS. 3–6 and the external contours of part 23 may approximate the contours of any of the probes of FIGS. 3–6.

The rear end of part 23 has a metal conductive collar 25 which is formed as a threaded spiral similar to the end of a flashlight housing over which the cap is screwed on. Extending forward from the forward end of part 24 is a mating metal collar 26 which is fashioned to screw over collar 25 to permit the attachment of part 24 to part 23.

Part 24 comprises a collar 26, lamp 13 and a battery contact 27 interconnected and encapsulated as a unit with the encapsulating material 20' forming its cylindrical body and rearward end which serves as a lens for the light emitted by lamp 13. One lead of lamp 13 is connected to collar 26 and the other is connected to battery contact 27 which is cast into the center of the forward surface of the cylindrical body of material 20'.

Part 23 comprises battery 11, switch 12, resistor 14, collar 25 and a battery spring contact 28. Collar 25, switch 12, resistor 14 and spring contact 28 are cast as a unit with a body of the encapsulating material 20''. Switch 12 and resistor 14 are positioned in the forward projection 21 of part 23 which projection is formed in the manner identified above. Collar 25 is positioned at the rearward end and contact 28 is located at the base of a cylindrical cavity 29 which is dimensioned to receive battery 11. Cavity 29 is centrally aligned within part 23 and it opens at the rearward end of part 23. The spring contact 28 has one end embedded in material 20'' and connected electrically to one lead of switch 12. Resistor 14 is connected between the second lead of switch 12 and collar 25.

When parts 23 and 24 are assembled together by screwing collar 26 over collar 25, contact 27 makes electrical contact with the positive terminal 31 of battery 11, and the base or negative terminal of battery 11 makes contact through spring contact 28 to relay 21 while collars 25 and 26 complete contact between lamp 13 and resistor 14 so that the closed electrical circuit of FIG. 1 is effected to permit the operation of probe 10'' in a manner identical to that of probe 10. Battery 11 may readily be replaced as necessary by removing part 24 from part 23.

Figure 9:
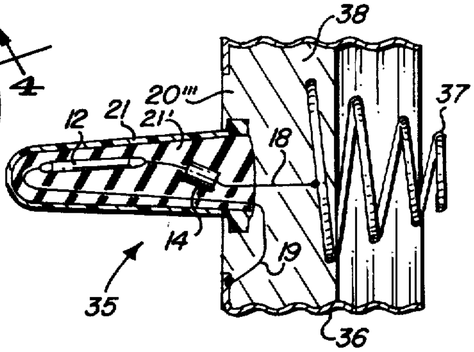
FIG. 9 is a cross-sectional view of FIG. 8 taken along line 9—9 of FIG. 8.
Figure 8:
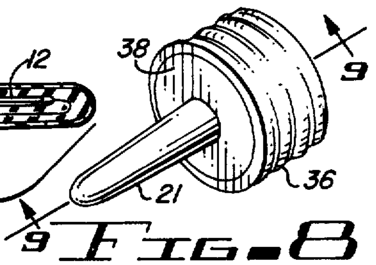
FIG. 8 is a perspective view of a special flashlight end-cap which may be utilized as a replacement for the regular end-cap of an ordinary flashlight as a means for converting the flashlight into a variation of the solenoid and relay probe of the invention.

In yet another variation of the invention which permits the conversion of an ordinary flashlight to a solenoid and relay probe, an adaptor cap 35 is shown as FIGS. 8 and 9. The adaptor cap 35 comprises switch 12, a collar 36 and a spiral spring 37 encapsulated as a unit, again using the encapsulating material 20''' for the cap and encapsulating material 21' for the projection 21. The adaptor cap 35 has external contours approximating the contours of the forward or sensing end of probe 10 including projection 21 which may be modified if desired, as in FIGS. 5 or 6. Collar 36 has formed threads which are dimensioned to fit over the rear end of an ordinary flashlight housing in place of the usual end cap. The rearward portion of collar 36 is open and filled with a body 38 of material 20'''. Projection 21 is molded into body 38 and extends rearward from the center of the body of material 20''' contained within collar 36. Spring 37 has its base embedded in the forward portion of body 38 of material 20''' and extends forwardly therefrom. The first lead 18 of switch 12 is connected to spring 37 and the second lead 19 is connected to collar 36 so that when cap 35 is attached to the base of an ordinary flashlight, switch 12 is serially connected with the batteries, the lamp and the ON/OFF switch of the flashlight. The resulting assembly becomes an operative solenoid or relay probe when the ON/OFF switch is in the ON position, the closing of switch 12 now effecting the energization of the flashlight lamp.

Because of the low parts costs adaptor 35 may prove economically advantageous over the complete probes 10, 10' and 10''.

While the probes 10, 10' and 10'' as described permit a realization of the initial objects of the invention they do not provide the enhanced sensitivity or the adjustability of sensitivity which is also desired.

Figure 10:
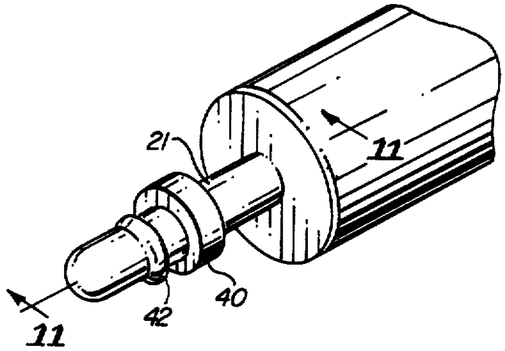
FIG. 10 is a partial perspective view of a modified form of the probe of FIGS. 1-4, the modification comprising the addition of a toroidal magnet which is installed over the tip of the probe to provide enhanced or adjustable sensitivity.
Figure 11:
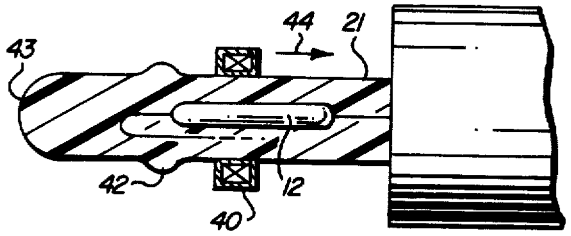
FIG. 11 is a cross-sectional view of the probe of FIG. 10 taken along line 11—11 of that Figure.

FIGS. 10 and 11 illustrate a further embodiment of the invention in which a permanent magnet 40 is installed over the projection 21, the projection 21 having in this case a constant diameter over most of its length. As in the case of probes 10 and 10'', the projection 21 houses the reed switch 12 as shown in FIG. 11.

The magnet 40 is in the shape of a toroid and it produces a magnetic field which passes axially through the center of the toroid in longitudinal alignment with the switch 12. The magnet 40 may be wound from magnetic tape or it may be cast from a permanent magnet material and magnetized in the desired manner. The inside surface of the toroidal opening of magnet 40 is cylindrical and has a diameter just enough greater than that of projection 21 to permit magnet 40 to be snugly slidable over projection 21. Because of the slight flexibility of projection 21 and because of the fit between projection 21 and magnet 40, the magnet 40 may be moved to any desired position along the length of projection 21 and it will remain in that position unless it is forcibly moved to another position. Optionally, an annular ridge 42 may be provided around projection 21. The ridge 42 is located outboard of magnet 40 at a location near the forward end 43 of projection 21 where it serves as a barrier to prevent magnet 40 from becoming dislodged from projection 21 and subsequently being lost or misplaced.

The magnetic field produced by magnet 40 is sufficient to close the contacts of switch 12 when the position of magnet 40 is directly over the switch 12 as shown in FIG. 11. As the magnet is moved toward the base of projection 21 in the direction of arrows 44 the magnetic field strength along the axis of the switch 12 decreases and at some position of the magnet 40 the switch contacts will open. At this point a very small incremental increase in field strength as from an external source will cause the switch 12 to close. The effect is thus a very significant increase in probe sensitivity. As the magnet 40 is moved farther and farther from the position shown in FIGS. 10 and 11 in the direction 44 a correspondingly larger external field is required to close switch 12 and the effective sensitivity of the probe is reduced accordingly. As the magnet 40 approaches a position near the base of projection 21 the sensitivity of the probe becomes less than is obtained if magnet 40 is removed entirely. This effect apparently results from the shape of the field pattern produced by magnet 40 which in the latter position of magnet 40 causes one reed of switch 12 to be drawn away from the other and thus to restrain switch closure. A measured field must then first overcome the field produced by magnet 40 to close switch 12.

The magnet 40 as shown in FIGS. 10 and 11 thus provides for an adjustable sensitivity of the probe. The maximum value of sensitivity may be as high as fifty times that of the unmodified probes 10 or 10'' and the minimum value may be considerably lower than the unmodified value. The very high sensitivity is useful in detecting very low-strength magnetic fields as are produced by a reed relay or by a current flowing in an electrical conductor. The adjustable sensitivity is useful in distinguishing the source of a field being probed when two possible sources are located in close proximity with each other. Thus, for example, if the sensitivity is appropriately reduced, the probe will have to be held very near the source to permit detection. The effects of other sources in the vicinity are thus minimized.

Figure 13:
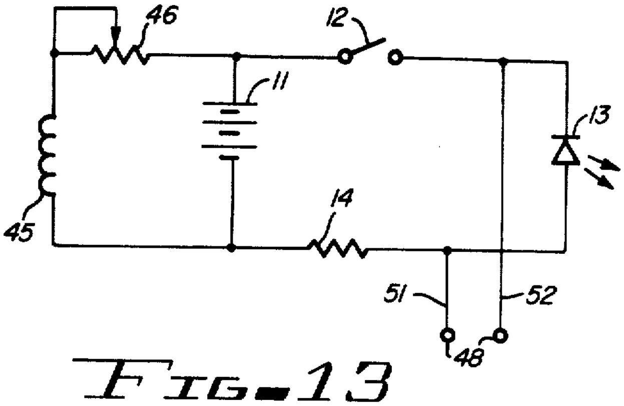
FIG. 13 is a circuit diagram showing the internal electrical components and interconnections of the probe of FIG. 12.
Figure 12:
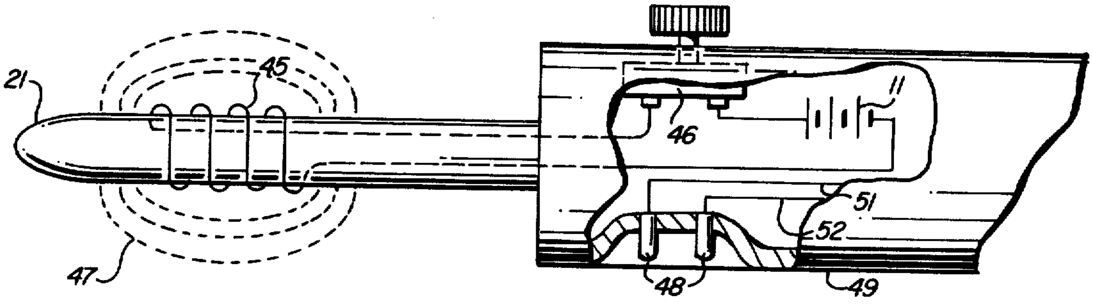
FIG. 12 is a side view of another modification of the probe of FIGS. 1-4, the modification comprising the addition of a magnetizing coil which is adjustably excitable for the purpose of providing enhanced or adjustable probe sensitivity, and including in addition a pair of terminals for the connection of external monitoring means.

Yet another embodiment of the invention is illustrated in FIGS. 12 and 13. In FIG. 12 a coil 45 of an electrical conductor is wound over the projection 21, the projection 21 again enclosing the reed relay 12 as in the constructions of FIGS. 3, 4 and 7–11. The coil 45 is serially connected with an adjustable resistance 46 across the battery 11. A d-c current flowing from the positive plate of battery 11 flows through resistance 46, and through coil 45 to the negative terminal of battery 11. The current flowing in coil 45 produces a magnetic field 47 which passes longitudinally through the axis of the reed switch enclosed in projection 21 in the manner of the field produced by the permanent magnet 40 of FIGS. 10 and 11. The strength of the field 47 is adjustable by means of adjustable resistance 46, and at some value of resistance the field 47 will be adequate to close switch 12. At a very slightly higher value of the resistance 46 the switch will normally be open but will close in the presence of a very weak external field. The excited coil 45 thus serves as another means for enhancing the sensitivity of the probe.

Also shown in FIG. 12 is a pair of terminals 48 located in the body 49 of the probe. Connected to the terminals 48 are two electrical conductors 51 and 52 which are connected across the lamp 13. An external connector (not shown) may be attached to the contacts 48 to make connection from terminals 48 to an external monitoring means such as an oscilloscope or an electronic counter to permit the monitoring by such means of a-c or pulsating d-c signals detected by the probe.

A circuit diagram for a probe incorporating the features of FIG. 12 is shown in FIG. 13. As shown also in FIG. 1, the reed switch 12, the indicator 13 and the resistor 14 are serially connected across the battery 11. The adjustable resistor 46 and the coil 45 are also serially connected in a parallel branch across the battery 11 and the terminals 48 are connected across the indicator 13 by the conductors 51 and 52. The variable resistor 46 should preferably be of a type having an open or OFF position so that the coil 45 may be completely disconnected from the battery 11 when the probe is not in use.

Figure 14:
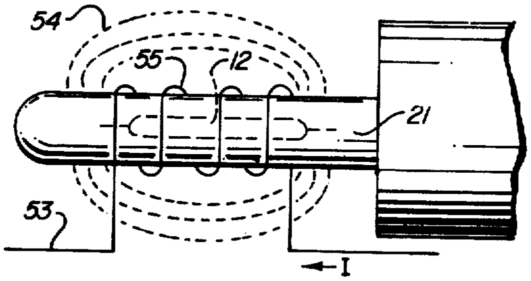
FIG. 14 is an illustration of a utilization of the probe of FIGS. 1-4 for the monitoring of relatively weak electrical currents flowing in electrical conductors.

FIG. 14 illustrative of the use of the tool 10, or 10'' for the detection of relatively low values of currents flowing in an electrical conductor. If the conductor 53 is wound around the projection 21, the current I flowing in the conductor produces a magnetic field 54 which operates the reed switch 12 enclosed by the projection 21. The strength of the field 54 is proportional to the product of the current I and the number of turns of the coil 55 produced by the winding of conductor 53 on projection 21. A relatively low value of current flowing through a coil of a relatively large number of turns will thus operate the switch 12. Such an arrangement is useful for the monitoring of a-c or d-c currents. It might, for example, be employed to monitor exciting currents in a fuel injection system, currents flowing in the conductors of electronic equipment, etc. The monitoring of currents in this manner obviates the need for cutting or unsoldering wires for current measurements.

Figure 15:
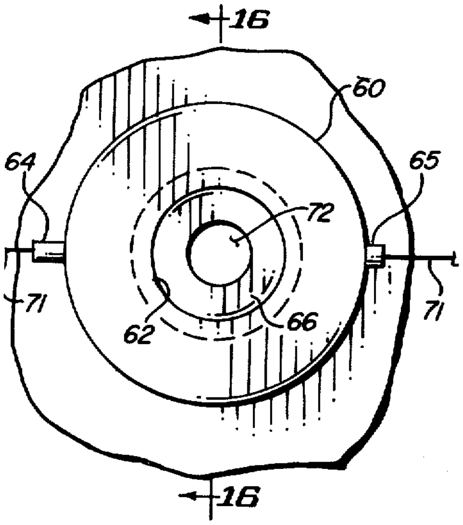
FIG. 15 is a front view of an accessory for use with the probe of FIGS. 1-4, the accessory being shown mounted in a panel or housing of the equipment to be monitored.
Figure 16:
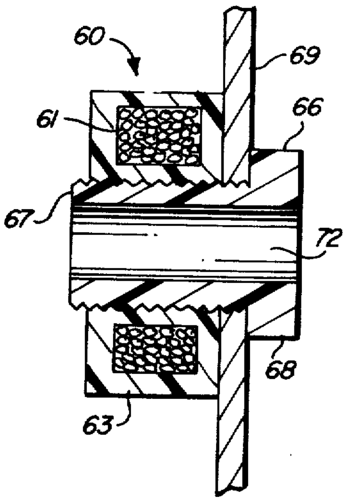
FIG. 16 is a cross-sectional view of the accessory of FIG. 15, taken along line 16—16 of that Figure.

Because there is ordinarily not sufficient conductor length to be wound around the projection 21, it may be found more convenient to design certain equipment to accommodate the probe of the invention as a means for conducting regularly scheduled operational measurements. For this purpose the current test-point accessory 60 of FIGS. 15 and 16 will be found useful. The accessory 60 comprises a multi-turn coil 61 wound in toroidal form with a central opening 62. The coil 61 is encapsulated in a toroidal plastic or otherwise non-conductive case 63. The start and finish leads of the coil 61 are connected, respectively to terminals 64 and 65 which extend through opposite sides of the case 63. The inside cylindrical surface of case 63 is threaded to mate with a threaded plastic grommet 66. The grommet has a threaded body 67 and a shoulder 68. The body 67 is passed through a hole in the chassis or enclosure wall 69 of an electronic assembly and is threaded into the threaded opening of case 63. With the accessory 60 thus secured to the enclosure wall 69, it is then electrically connected in series with the electrical conductor 71 that carries the current I which is to be monitored. The terminals 64 and 65 permit the soldering of the conductor 71 to the coil 61. A hole 72 through the center of the grommet 66 is of sufficient diameter to receive the projection 21 of probe 10 or 10". The current I may thus very conveniently be monitored by simply inserting the projection 21 through the hole 72. Several such accessories 60 may be built into a particular piece of equipment which is expected to require frequent repeated measurements of this nature.

Figure 17:
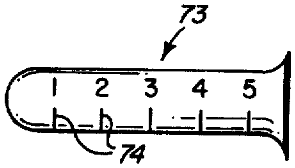
FIG. 17 is a side view of another accessory for use with the probe of FIGS. 1-4.

In the monitoring of relays for the detection of relay excitation it is often desirable to be able to distinguish between full excitation and only partial excitation which might result from a low supply voltage or from other types of circuit faults. If full excitation is present it may only be necessary to extend the tip of the probe a short distance past a given point of reference on the armature of the relay. If the relay is only partially excited, it will be necessary to extend the tip a greater distance past the given point. Where frequent or repeated measurements are made on a given relay or if measurements are made on more than one relay of a given type, it will thus be useful to have a means for observing with reasonable accuracy the distance the top of the probe must be extended past the reference point to obtain an indication of excitation. For this purpose the graduated cylindrical sleeve 73 of FIG. 17 is provided.

The sleeve 73 is of appropriate dimensions to be installed snugly over the projection 21 of probe 10 or 10". In the illustration of FIG. 17, five equally spaced and numbered graduation marks 74 are provided along the length of sleeve 73. The sleeve 73 may be permanently or temporarily installed over projection 21 or the projection 21 may itself be embossed with the numbered graduations.

It should be noted that the probe disclosed is also capable of identifying the north and south poles of magnets. By placing the north pole side of magnet 40 adjacent the end of probe 21, the probe when placed adjacent a pole of a magnet will close the contacts of switch 12 energizing the lamp 13 indicating a north pole of the magnet. If the south pole of the magnet is placed adjacent the end of the probe energization of the lamp will indicate a south pole of the magnet being investigated.

An effective and inexpensive relay and solenoid probe is thus provided which complies in all respects with the stated objects of the invention, and while but a few embodiments of the invention have been illustrated and described, it will be apparent to those skilled in the art that various changes and modifications may be made therein without departing from the spirit of the invention or from the scope of the appended claims.

What is claimed is:

1. A probe for sensing magnetic field characteristics generated by electric devices comprising in combination:

a non-magnetic housing, a magnetizable switch forming a pair of contactable members mounted within said housing, at least one of said members being movable in said housing relative to the other for engaging the other when in a magnetic field, a lamp, battery means having a pair of terminals, a first means for connecting said lamp and said members in a series arrangement across the terminals of said battery means, said members when exposed to a first magnetic field generated by an electric device deflecting relative to each other to engage to complete a circuit across said battery means to illuminate said lamp, encapsulating means for said probe, said encapsulating means comprising a first part forming a cylindrical configuration encasing said lamp and battery means and a second part forming an elongated constant diameter cylindrical projection of said first part and of a size reduced from said first part and containing said housing, and a magnetic means for mounting on and surrounding at least a part of said projection for producing a second constant magnetic field which passes substantially longitudinally through the axis of said switch to aid in closing said switch, said magnetic means comprises a magnet in the shape of a toroid slidably mounted around and snugly fitting the periphery of said projection for increasing the sensitivity of said probe with the center of said magnet being substantially in longitudinal alignment with said members, said magnet being movable along said projection and over said members to a given position causing engagement of said members and when moved from said position along said projection to another position opening said contacts.

2. The probe set forth in claim 1 wherein:

said second part is formed of a resilient material molded into one end of said first part and is distortable relative to said cylindrical configuration without rupturing the encapsulated probe.

3. The probe set forth in claim 1 in further combination with:

an annular ridge formed around said projection between the tip thereof and said magnet for keeping said magnet from sliding off of said projection.

4. The probe set forth in claim 1 wherein:

said cylindrical configuration comprises two interconnectable parts, one of said two interconnectable parts contains said lamp, and the other of said interconnectable parts contains said housing and said battery means.

5. The probe set forth in claim 4 wherein:

said battery means is exposed when the interconnected parts of said cylindrical configuration are separated for replacement purposes.

* * * * *